United States Patent
Fenouillet-Beranger et al.

(10) Patent No.: US 10,074,802 B2
(45) Date of Patent: Sep. 11, 2018

(54) DEVICE WITH TRANSISTORS DISTRIBUTED OVER SEVERAL SUPERIMPOSED LEVELS INTEGRATING A RESISTIVE MEMORY

(71) Applicant: COMMISSARIAT A L'ENERGIE ATOMIQUE ET AUX ENERGIES ALTERNATIVES, Paris (FR)

(72) Inventors: Claire Fenouillet-Beranger, Voiron (FR); Elisa Vianello, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/365,378

(22) Filed: Nov. 30, 2016

(65) Prior Publication Data

US 2017/0162788 A1    Jun. 8, 2017

(30) Foreign Application Priority Data

Dec. 2, 2015   (FR) ..................................... 15 61742

(51) Int. Cl.
*H01L 45/00* (2006.01)
*H01L 27/24* (2006.01)

(52) U.S. Cl.
CPC ...... *H01L 45/1683* (2013.01); *H01L 27/2436* (2013.01); *H01L 45/085* (2013.01); *H01L 45/1233* (2013.01); *H01L 45/1266* (2013.01); *H01L 45/145* (2013.01)

(58) Field of Classification Search
CPC ................ H01L 45/1683; H01L 27/2436

USPC ............................................................. 257/4
See application file for complete search history.

(56) References Cited

U.S. PATENT DOCUMENTS

| | | | |
|---|---|---|---|
| 7,804,134 B2 | 9/2010 | Coronel et al. | |
| 2006/0054950 A1* | 3/2006 | Baek ..................... | H01L 27/112 257/295 |
| 2006/0071074 A1 | 4/2006 | Konevecki et al. | |
| 2009/0218556 A1 | 9/2009 | Park et al. | |
| 2013/0153847 A1 | 6/2013 | Park et al. | |
| 2015/0235949 A1* | 8/2015 | Yu ....................... | H01L 23/3128 257/774 |

OTHER PUBLICATIONS

U.S. Appl. No. 14/887,831, filed Oct. 20, 2015, 2016/0111330 A1, Claire Fenouillet-Beranger et al.
U.S. Appl. No. 15/176,716, filed Jun. 8, 2016, Claire Fenouillet-Beranger et al.
U.S. Appl. No. 15/184,076, filed Jun. 16, 2016, Claire Fenouillet-Beranger et al.
U.S. Appl. No. 15/335,092, filed Oct. 26, 2016, Claire Fenouillet-Beranger et al.

(Continued)

*Primary Examiner* — Shaun Campbell
*Assistant Examiner* — Warren H Kilpatrick
(74) *Attorney, Agent, or Firm* — Oblon, McClelland, Maier & Neustadt, L.L.P.

(57) ABSTRACT

Method for producing a device with transistors distributed over several levels and provided with a resistive memory cell having an electrode formed of a conductor portion belonging to a connection element connected to a transistor of a given level.

11 Claims, 7 Drawing Sheets

(56) References Cited

OTHER PUBLICATIONS

French Preliminary Search Report dated Jul. 20, 2016 in French Application 15 61742 filed on Dec. 2, 2015 (with English Translation of Categories of Cited Documents).
Netalija Jovanovic et el. "Design insights for reliable energy efficient OxRAM-based flip-flop in 29nm FD-SOI" IEEE. 978-1-5090-0259, Oct. 5, 2015, pp. 2.
M. UEKI et al., "Low-Power Embedded ReRAM technology for IoT Applications," 2015 Symposium on VLSI Technology Digest of Technical Papers, Jun. 1, 2015, pp. 2.

\* cited by examiner

DEVICE WITH TRANSISTORS DISTRIBUTED OVER SEVERAL SUPERIMPOSED LEVELS INTEGRATING A RESISTIVE MEMORY

TECHNICAL FIELD AND PRIOR ART

The present application pertains to the microelectronics field, and more particularly to that of resistive memories and has the aim of describing a device provided with improved memory cells, notably in terms of integration density.

So-called "resistive" memory cells make it possible to confer to memory devices a non-volatile character while at the same time having low bulk.

Several types of resistive memory cells exist, which include RRAM (Resistive Random Access Memory) or OxRAM (Oxide-based Resistive Random Access Memory) cells. These memory cells have a common operating principle: their changes of state are due to changes in resistivity of a material arranged between two electrodes.

The document "Low-Power Embedded ReRam Technology for IoT Applications", of Ueki et al., 2015 Symposium on VLSI Technology Digest of Technical Papers, describes for example a resistive random access memory (ReRAM) cell in which the material arranged between the electrodes is a high-k dielectric: $Ta_2O_5$.

The problem is posed of producing a novel memory device provided with resistive memory cells and having improved integration density.

DESCRIPTION OF THE INVENTION

An embodiment of the present invention relates to a method for producing a device with transistors distributed over several levels and provided with at least one resistive memory cell including the steps consisting in:
  forming a structure provided with one or more connection elements in at least one first insulator layer surmounting a first transistor of a given level of components, a first electrode of the resistive memory cell being formed of at least one conductor portion of a first connection element among said one or more connection elements,
  forming a dielectric region on an upper face of the structure, the dielectric region lying on said conductor portion of the first connection element,
  assembling on the upper face of the structure a support including a semiconductor layer in which at least one second transistor is capable of being produced,
  forming at least one second insulator layer, the second insulator layer surmounting the second transistor at least partially produced and the first electrode of the resistive memory cell,
  forming one or more openings through the second insulator layer, at least one first opening among the one or more openings revealing the dielectric region of the resistive memory cell,
  forming in the first opening at least one second electrode of the resistive memory cell on the dielectric region.

Thus, transistors distributed over several levels and a resistive memory cell are produced concomitantly.

"At least partial" production of the second transistor before the formation of the second insulator layer is taken to mean that the semiconductor channel, source and drain regions are defined. Advantageously, the gate of the second transistor may also be produced before the formation of the second insulator layer.

The fact of producing the dielectric region before forming the openings through the second insulator layer makes it possible to avoid having to form this dielectric region in the first opening, which could require the implementation of a masking or instead to have to carry out an etching of the dielectric region in certain zones, for example in zones situated on or facing the second transistor.

The memory cell produced may in particular be an OxRAM type memory.

The dielectric region lying on the conductor portion of the first connection element may be a region of at least one dielectric layer covering the upper face of the structure and that is formed by full wafer deposition.

Advantageously, the dielectric layer is not etched to constitute the dielectric region intercalated between the electrodes of the memory cell.

This dielectric layer may be made of a high-k material.

The support including the semiconductor layer in which the second transistor is formed may for its part be assembled by molecular bonding. A bonding on the dielectric layer or on a layer formed on the dielectric layer may be carried out.

Advantageously, the assembly between the structure and the support is carried out without prior etching of the dielectric layer having been carried out. Thus the full wafer dielectric layer is conserved. This dielectric layer may serve as protective layer.

According to a possibility of implementation of the method, the first electrode of a resistive memory cell formed of the conductor portion is coated with at least one metal layer. In this case, the production of this metal layer may include the steps of:
  forming a mask on the first insulator layer, the mask being provided with at least one opening facing the conductor portion,
  etching the first insulator layer through the opening of the mask such as to reveal the conductor portion,
  depositing the metal layer.

This deposition may be followed by planarization (CMP).

At least one second opening among said openings formed in the second insulator layer may reveal a region of the second transistor.

In this case, the method may then include the formation of a conductor element in the second opening, the conductor element being connected to the second electrode of the resistive memory cell or forming the second electrode.

According to an implementation possibility, the method may include, after formation of the second insulator layer, the steps of:
  forming a hole traversing the second insulator layer and the layer of dielectric material, the hole revealing at least one other connection element among said one or more connection elements, then
  filling the hole with a conductor material.

It is thus possible to form a conductor element in contact with at least one of the connection elements, this conductor element being accessible by a level above the given level.

The hole that is filled to produce this conductor element may be formed after said openings and through a masking layer blocking said openings.

Thus, the conductor element is produced while protecting the cell and the second transistor.

The masking may be removed prior to filling the openings and the hole with conductor material.

According to an implementation possibility, the first connection element may be connected to the first transistor. Thus, the first electrode of the memory cell is connected to a transistor of the given level.

According to an implementation possibility, the method may include the steps consisting in:
forming another opening traversing the second insulator layer and revealing a conductor part connected to said first connection element,
forming in this opening at least one contact pad with said conductor part.

Thus, the connection pad accessible from a level above the given level may be connected to the first electrode of the resistive memory cell.

According to another aspect, the present invention relates to a device implemented using a method as defined previously.

An embodiment of the present invention relates to a device with transistors distributed over several superimposed levels of transistors and provided with at least one resistive memory cell, the device including:
a structure provided with one or more connection elements in at least one first insulator layer surmounting a first transistor of a given level of components,
a resistive memory cell comprising a first electrode formed of at least one conductor portion of a first connection element among said one or more connection elements, the memory cell being moreover provided with a dielectric region lying on the conductor portion of the first connection element and a second electrode of the resistive memory cell on the dielectric region, the device moreover including at least one second transistor of a level above the given level.

BRIEF DESCRIPTION OF THE DRAWINGS

The present invention will be better understood on reading the description of examples of embodiments given for purely indicative purposes and in no way limiting, while referring to the appended drawings in which.

Identical, similar or equivalent parts of the different figures bear the same numerical references so as to make it easier to go from one figure to the next.

The different parts represented in the figures are not necessarily according to a uniform scale in order to make the figures more legible.

Moreover, in the description hereafter, terms that depend on the orientation of the structure such as "vertical", "horizontal", "upper", "lower", "lateral", apply in considering that the structure is oriented in the manner illustrated in the figures.

DETAILED DESCRIPTION OF PARTICULAR EMBODIMENTS

An example of method for producing a device provided with transistors distributed over several levels and at least one resistive memory cell will now be given with reference to FIGS. 1A-1K.

In this example, the memory cell that is produced may be of OxRAM type, that is to say a memory based on the formation and the reversible rupture of conductor filament(s) in a metal oxide based dielectric material.

Figure 1A:
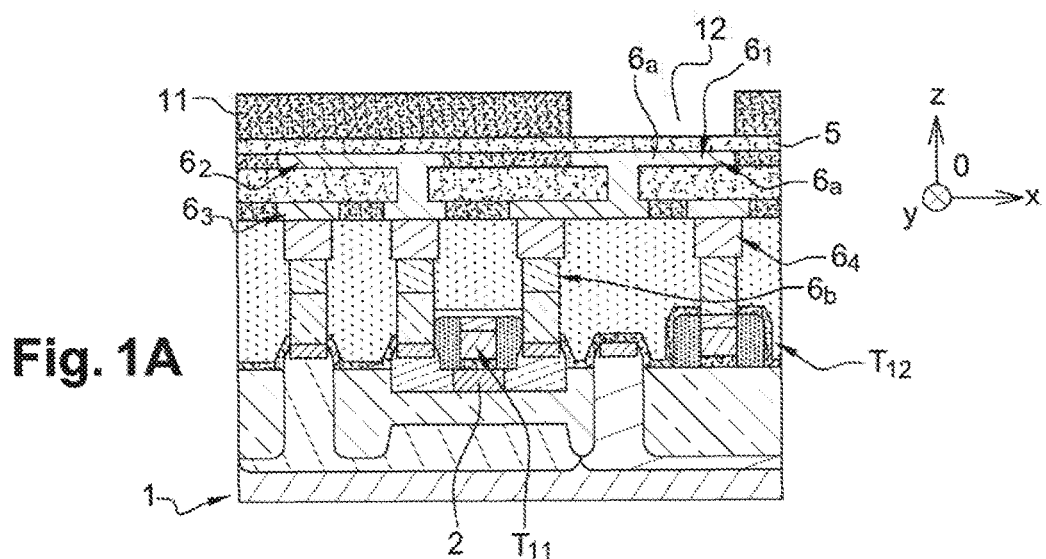
FIGS. 1A-1K serve to illustrate an example of method for producing a device with superimposed transistor levels and provided with a resistive memory cell.
Figure 1B:
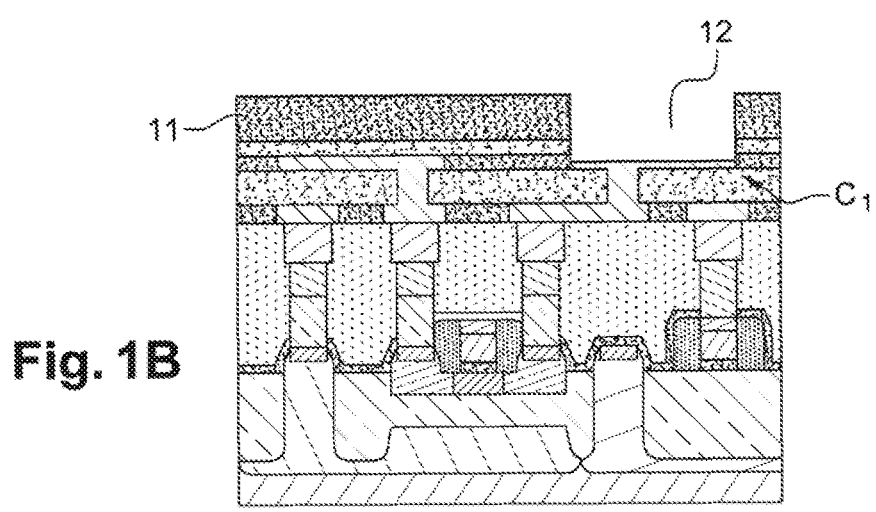
Figure 1C:
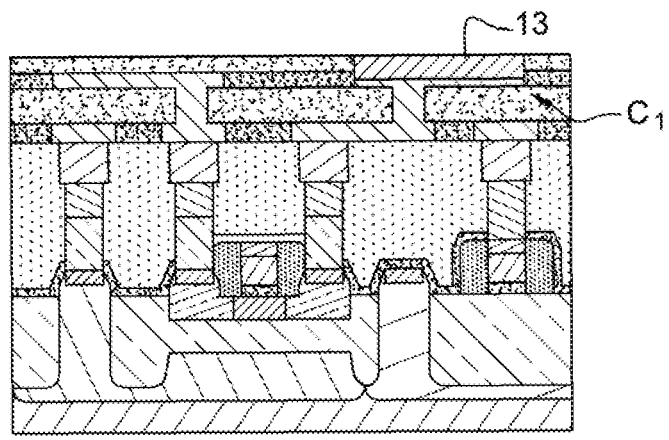
Figure 1D:
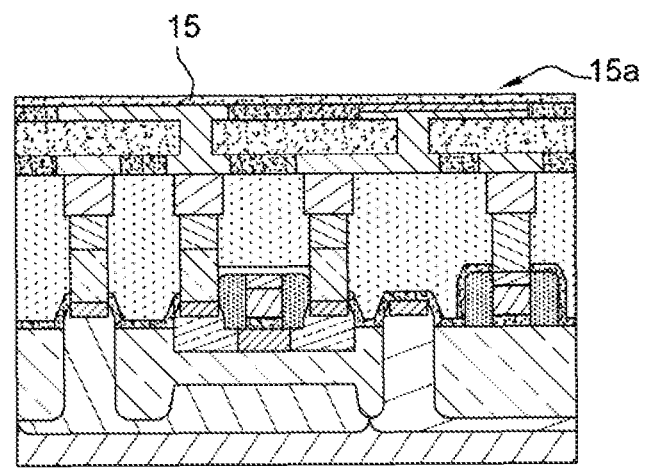

Reference is firstly made to FIG. 1A illustrating a stage or level of the device, in particular the first level $N_1$, among a plurality of stages or levels $N_1, \ldots, N_k$ (with k>1) of electronic components distributed over three dimensions and formed on a substrate 1.

The substrate 1 may be a bulk substrate or a semiconductor on insulator substrate for example of SOI (Silicon On Insulator) type. Such a substrate is typically provided with a superficial semiconductor layer lying on an insulator layer.

The level $N_1$ comprises one or more transistors $T_{11}$, $T_{12}$ for example of MOS type, of which at least the channel region is formed in a semiconductor layer 2. The transistors $T_{11}$, $T_{12}$ are covered with at least one insulator layer 5. This insulator layer 5 may be formed of a stack of several sub-layers of insulator material such as for example $SiO_2$ and SiN.

One or more connection elements $6_1$, $6_2$, $6_3$, $6_4$, are produced in the insulator layer 5. In this example, the connection elements $6_1$, $6_2$, $6_3$, $6_4$, each enable a contact to be made on a region of a transistor $T_{11}$, $T_{12}$ or the semiconductor layer 2 of the first level $N_1$ or even of the substrate 1 on which this semiconductor layer 2 is formed. The connection elements $6_1$, $6_2$, $6_3$, $6_4$ may be formed of portions for example based on copper or tungsten.

Among the connection elements $6_1$, $6_2$, $6_3$, $6_4$, at least one first connection element $6_1$ is intended to form an electrode, in particular the lower electrode of the resistive memory cell $C_1$.

The first connection element $6_1$ comprises a horizontal portion 6a (that is to say which extends in a direction parallel to the semiconductor layer 2) connected to at least one vertical portion 6b (that is to say which extends in a direction orthogonal to the semiconductor layer 2). In FIG. 1A, the vertical direction corresponds to that of a vector z of an orthogonal reference point [O; x; y; z] whereas the horizontal direction is a direction parallel to the plane [O; x; y]. In this example of embodiment, the lower electrode of the cell $C_1$ is connected to a transistor $T_{11}$ of the level $N_1$.

FIG. 1A shows a step of producing a mask 11, for example based on photosensitive resin that is laid out on the insulator layer 5. This mask 11 comprises at least one opening 12 arranged facing the horizontal portion 6a of the connection element $6_1$.

Then (FIG. 1B), etching of the insulator layer 5 through the opening 12 of the mask 11 is carried out, such as to remove a thickness of the insulator layer 5 that is located on the horizontal portion 6a and which is not protected by the mask 11. The opening 12 in the insulator layer 5 is thus extended such as to reveal the horizontal portion 6a. The etching of the insulator layer 5 may be carried out for example by means of dry etching.

The mask 11 is then removed, for example using a stripping method.

Then (FIG. 1C), it is possible to produce a metal layer 13 on the first connection element $6_1$, and in particular on a horizontal portion 6a of this first connection element $6_1$. This metal layer 13 may in particular be formed when the etching described previously with reference to FIG. 1B is carried out so as to remove a thickness of the horizontal portion 6a of the connection element $6_1$. In this case, the metal layer 13 forms part of the lower electrode of the memory cell $C_1$. The metal layer 13 may be formed for example of a stack of Ti and TiN or TaN, Ir, or Pt. The metal layer 13 is preferably based on an inert material vis-à-vis oxygen. For example a metal layer 13 based on TiN is not very susceptible to oxidisation, which makes it possible to improve the reliability of the memory cell.

In order to smooth the surface of the insulator layer 5 and the metal layer 13 formed on the horizontal portion 6a, a chemical mechanical polishing (CMP) step may then be carried out. Then, a deposition of a layer of dielectric material 15 is carried out, for example based on a high-k material such as $HfO_2$ or $Ta_2O_5$ or $Al_2O_3$. "High-k" material is taken to mean a material with a dielectric constant k higher than that of silicon dioxide. The choke of the dielectric material used may be made as a function of that of the metal layer 13. A metal layer based on TiN is particularly suited when the dielectric layer 15 is based on $HfO_2$.

More generally, the layer of dielectric material 15 of the cell may be based on a transition metal oxide, such as $TiO_2$ or even an alloy of HfAlO type. It is also possible to provide the dielectric layer 15 formed of several sub-layers based on similar materials but of different stoichiometries, for example a stack of sub-layers of $Ta_2O_5$ and $TaO_x$ with x<2.5, $HfO_2$/$HfO_x$(with x<2). The dielectric layer 15 may also be formed of sub-layers of different materials, for example a stack of $Al_2O_3$ and $HfO_2$, or $HfO_2$ and $Ta_2O_5$. The dielectric layer 15 is advantageously deposited over the full wafer as in the example of embodiment of FIG. 1D.

"Full wafer" deposition is taken to mean that the dielectric layer 15 is formed such as to cover the entire upper face of the device in the course of being produced.

The dielectric layer 15 is thus produced on the insulator layer 5 as well as on one or more portions of connection elements, and in particular on the horizontal portion 6a of the first connection element $6_1$.

A region 15a of the dielectric layer 15 arranged on the horizontal portion 6a of the first connection element $6_1$ is intended to form a dielectric zone of the resistive memory cell $C_1$ provided to be intercalated between the lower electrode and an upper electrode.

Advantageously, the dielectric layer 15 is not etched and may serve as support to a so-called bonding layer 17, for example made of silicon oxide ($SiO_2$).

Figure 1E:
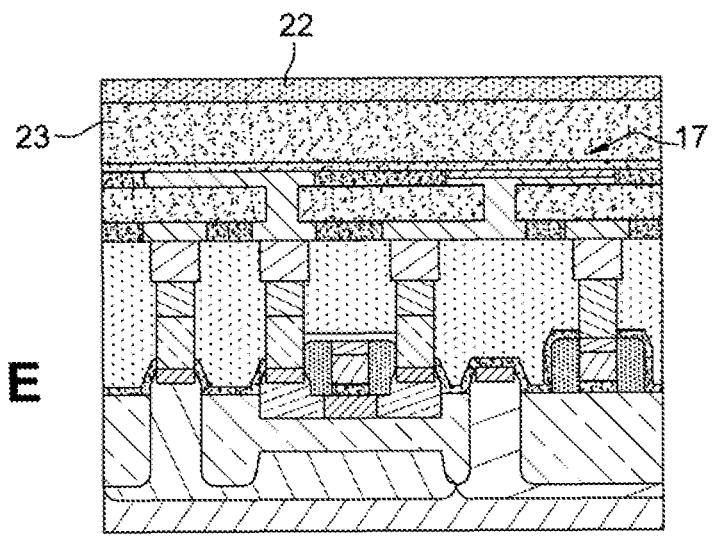

A support including a semiconductor layer 22 is then transferred, for example by molecular bonding. This support may also be provided with an insulator layer 23, for example based on $SiO_2$, which forms another bonding layer and which is placed in contact with the bonding layer 17 covering the level $N_1$ of components in order to carry out the molecular bonding. A bonding of oxide on oxide type may in particular be carried out (FIG. 1E). The support including the semiconductor layer 22 may be a substrate of semiconductor on insulator type, such as for example a SOI substrate.

Figure 1F:
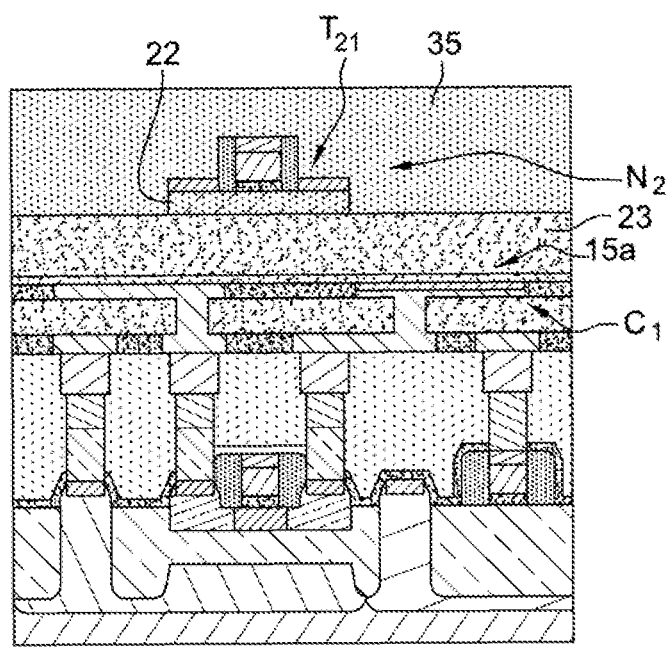

Then, from the semiconductor layer 22, a transistor $T_{21}$ of an upper level $N_2$, in particular a second level $N_2$ of the 3D stack is formed at least partially. Typically, the transistor $T_{21}$ implemented at this stage comprises a channel region that extends into the semiconductor layer 22, source and drain regions which may be at least partially formed in the semiconductor layer 22, as well as a gate dielectric and gate produced on the semiconductor layer 22 (FIG. 1F). It is then possible to form another insulator layer 35, for example based on $SiO_2$, such as to cover the second level $N_2$ of components and in particular the transistor $T_{21}$.

Figure 1G:
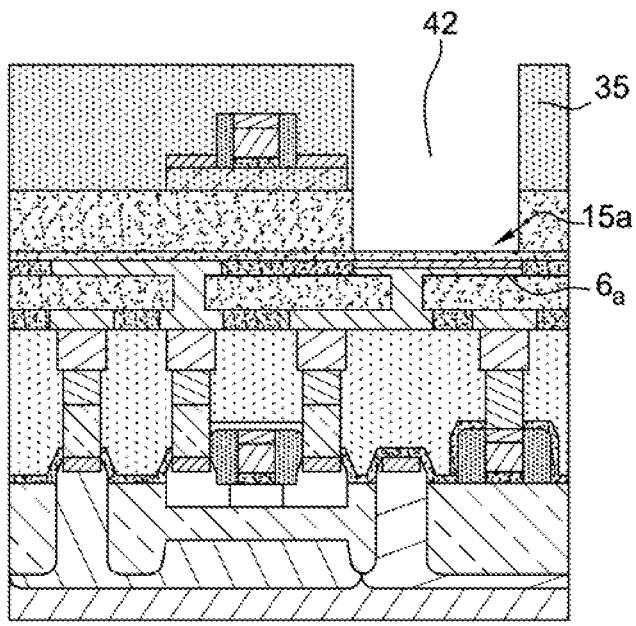

At least one opening 42 is then made in this insulator layer 35 (FIG. 1G).

This opening 42 also traverses the insulator layers 23 and 17 and emerges on the dielectric region 15a of the memory cell $C_1$. The opening 42 is thus produced facing the horizontal portion 6a of the first connection element $6_1$ forming the lower electrode of the memory cell $C_1$.

Figure 1H:
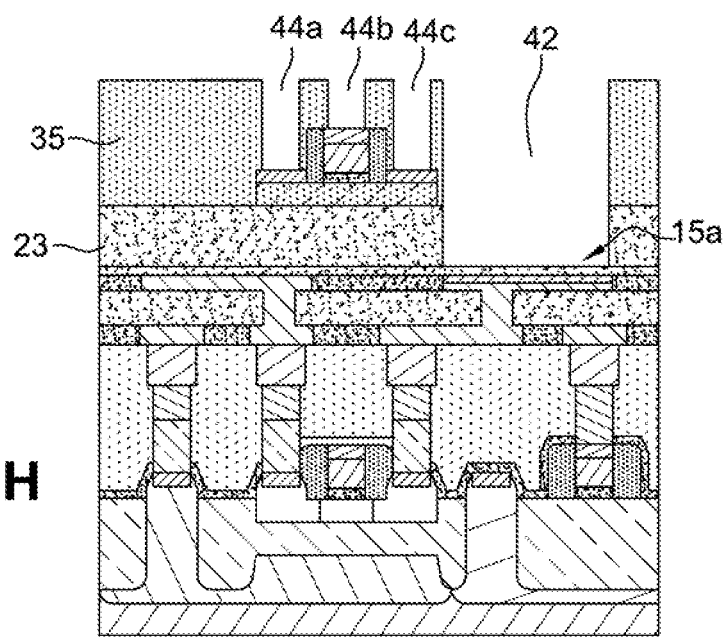

One or more other openings 44a, 44b, 44c revealing respectively one or more zones of the transistor $T_{21}$ of the level $N_2$ may also be made (FIG. 1H). An opening 44a is for example formed revealing the source region, an opening 44b revealing the gate, and an opening 44c revealing the drain region of the transistor $T_1$.

Figure 1I:
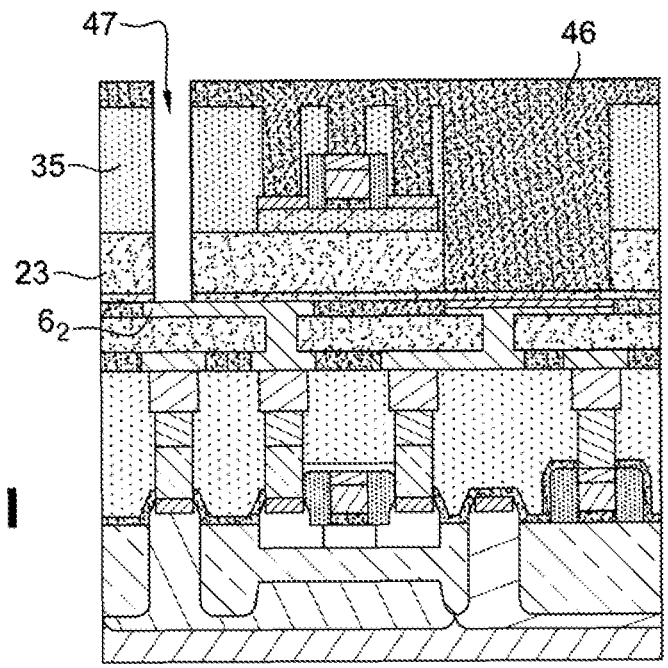
Figure 1J:
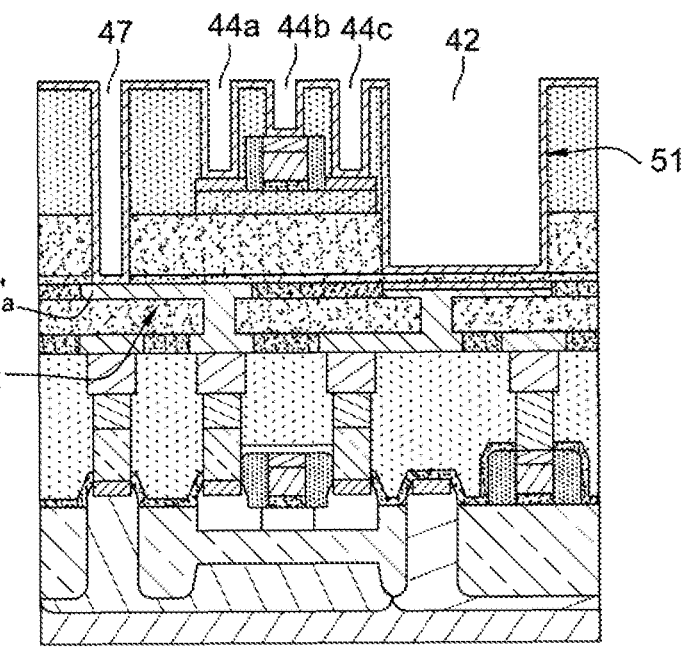

A masking 46 on the insulator layer 35 is then carried out. This masking 46 is provided such as to block the opening 42 in order to protect the region 15a of the dielectric layer 15 (FIG. 1I). In this example of embodiment, the masking 46 is also provided so as to block other openings already produced in the insulator layer 35, in particular the openings 44a, 44b, 44c. The masking 46 comprises a hole 47 situated facing at least one second connection element $6_2$ of the first level $N_1$ among the plurality of connection elements $6_1$, $6_2$, $6_3$.

Through the hole 47 of the masking 46, etching of the insulator layers 35, 23 is carried out. This etching is extended into the dielectric layer 15, such as to reveal the second connection element $6_2$. During this etching, the region 15a of the dielectric layer 15 is protected by the masking 46, in the same way as the transistor $T_{21}$ of level $N_2$.

The masking 46 is then removed, for example using a stripping method.

The opening 42 at the bottom of which is located the region 15a of the dielectric layer 15 is thus once again revealed.

Then, a deposition of at least one conductor layer 51 is carried out in this opening 42. The conductor layer 51 is thus formed on the dielectric region 15a of the memory cell. The conductor layer 51 is preferably metal and for example formed of a stack of Ti and TiN. The deposition of this conductor layer 51 may also be carried out in the openings 44a, 44b, 44c. The conductor layer 51 may thus also be laid out on the source, gate, drain regions of the transistor $T_{21}$ of the second level $N_2$ and on a portion 6'a of the second connection element $6_2$. In the example of embodiment of FIG. 1J, the conductor layer 51 is also deposited in the hole 47 so as to make contact on the connection element $6_2$ of the first level $N_1$.

Then, a filling of the openings and the hole in which the metal layer 51 has been formed may be carried out using a conductor material 53, in particular a metal such as tungsten (W).

Figure 1K:
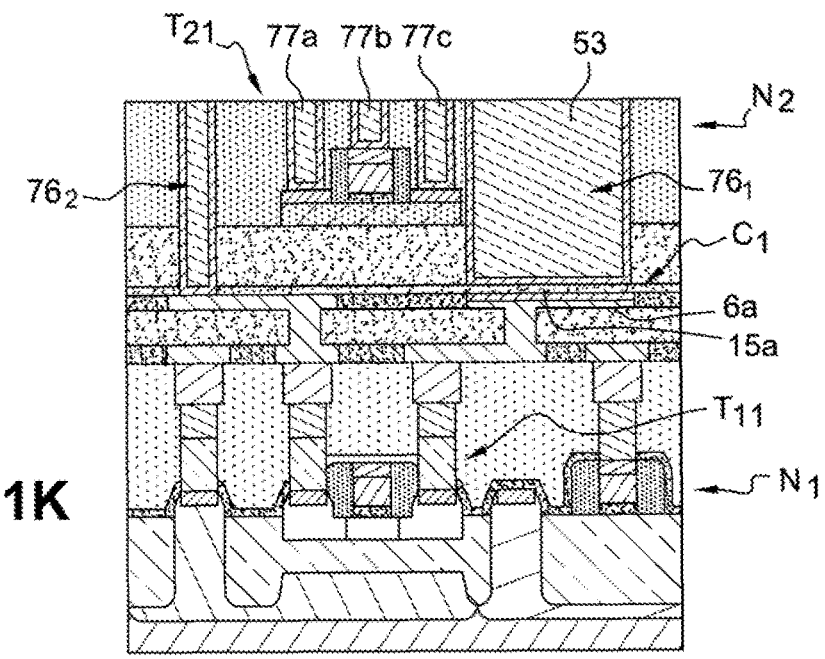

In the example of embodiment of FIG. 1K, the stack of the conductor layer 51 and other metal material 53 in the opening 42 makes it possible to produce a conductor element $76_1$. This conductor element $76_1$ forms an upper electrode of the memory cell $C_1$ arranged on the dielectric region 15a of the dielectric layer 15.

In this example of embodiment, the stack of the conductor layer 51 and the metal material 53 in the hole 47 makes it possible to produce another conductor element 762 on the second connection element $6_2$. This other conductor element 762 makes it possible to establish a contact on the transistor $T_{11}$ of the first level $N_1$. Other conductor elements 77a, 77b, 77c, are also formed respectively on the source region, gate and drain region of the transistor $T_{2l}$ of the second level $N_2$.

Figure 2:
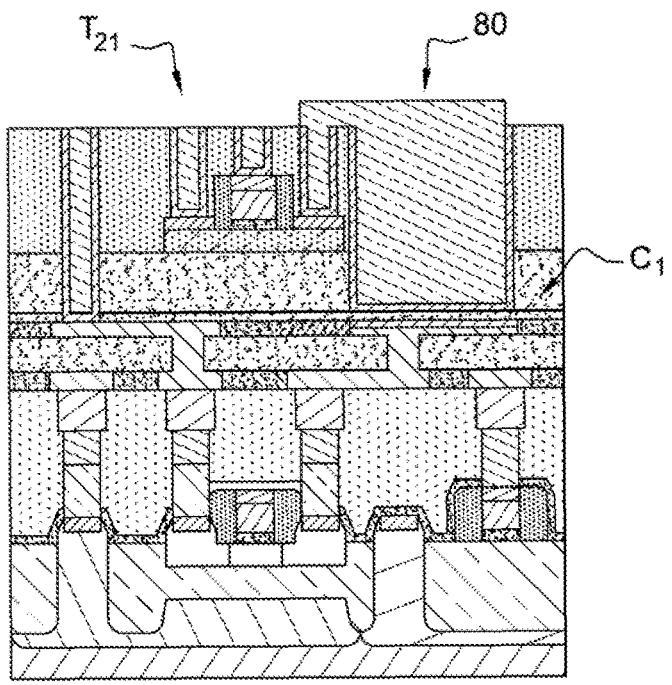
FIG. 2 illustrates a variant of embodiment in which an upper level transistor is connected to an upper electrode of the resistive memory cell.

A variant of embodiment illustrated in FIG. 2 provides to form a connection zone 80 between the resistive memory cell $C_1$ and the transistor $T_{21}$ of the second level $N_2$. The connection zone 80 is established in particular between the conductor element $76_1$ forming an upper electrode of the cell $C_1$ and an electrode of the transistor $T_{21}$ of the second level $N_2$, for example its drain electrode. The fabrication of the connection zone 80 may be carried out during filling such as described previously with reference to FIG. 1K so as to form a superficial metal layer lying on the upper face of the insulator layer 35. Then, this superficial metal layer is etched. To produce the connection zone 80, it is also possible to carry out a method including the formation of an insulator layer (not represented in FIG. 2), carrying out steps of photolithography and etching to form a hole revealing the elements $76_1$ and 77c, then filling the hole with a metal material, then planarization by CMP.

Figure 3:
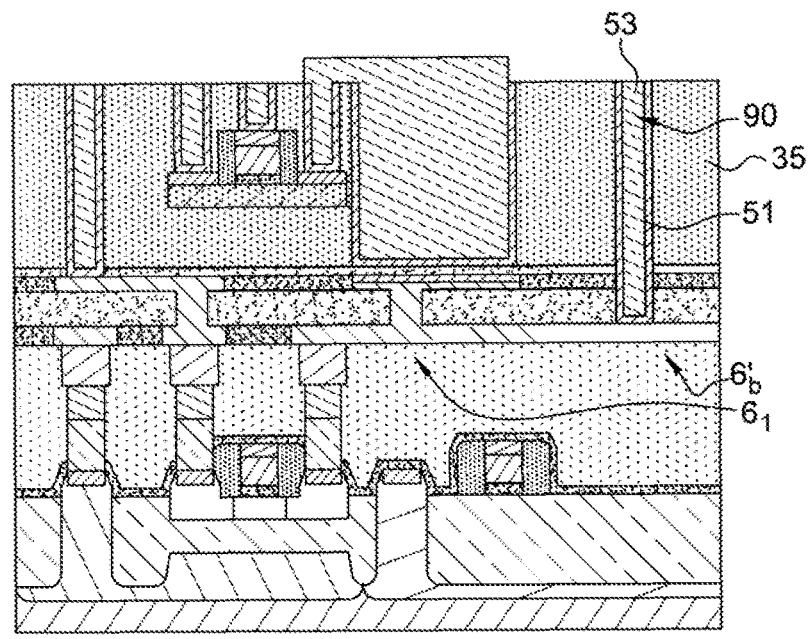
FIG. 3 illustrates an embodiment of a connection pad on a lower electrode of the resistive memory cell.

An implementation of the device with superimposed transistors given in FIG. 3 provides for the formation of a connection pad 90 in contact with the first connection element $6_1$ serving as lower electrode of the resistive memory cell $C_1$. This connection pad 90 may be formed by producing an opening through the insulator layers 35, 23, 17, 5, this opening revealing a conductor portion 6b connected to the first connection element $6_1$. Then, filling of the opening with conductor material is carried out.

Advantageously, the filling is carried out during the step described previously with reference to FIG. 1K during which a stack of a conductor layer 51 and the metal material 53 is deposited.

One or the other of the examples that have just been given corresponds to an embodiment in which the memory cell is formed between a first level and a second level of components. When there are more than two levels or stages it is also possible to produce this cell between two other stages, above the second level.

One or the other of the methods that have just been described may apply to other types of resistive memories in which the layer 15 is based on a material exhibiting a resistive switching effect.

Figure 4:
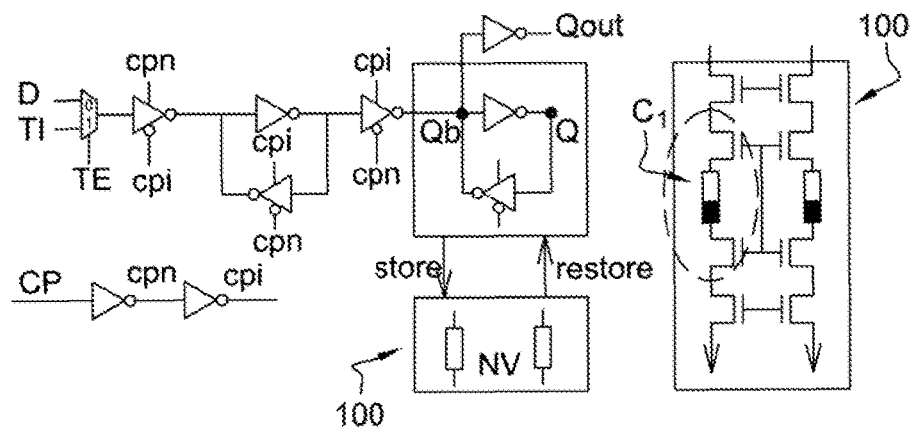
FIG. 4 illustrates a non-volatile memory stage of a circuit in which a device with superimposed transistor levels and with resistive memory cell is integrated.

A transistor device provided with a resistive memory cell $C_1$ as described in one or the other of the examples of embodiment described previously may be integrated in a non-volatile memory stage 100 of a circuit, for example a circuit forming a flip-flop and of the type of that described in the document of Jovanovic et al., "Design insights for reliable energy efficient non-volatile flip-flop in 28 nm FDSOI", IEEE Conference S3S 2015 (FIG. 4).

The invention claimed is:

1. A method for producing a device with transistors distributed over several levels and provided with at least one resistive memory cell comprising a first electrode, a second electrode, and a dielectric region arranged between the first electrode and the second electrode, the method comprising:
    forming a structure provided with one or more connection elements in at least one first insulator layer surmounting a first transistor of a given level of components, the first electrode of the resistive memory cell being formed of at least one conductor portion of a first connection element among said one or more connection elements;
    forming the dielectric region of the resistive memory cell on an upper face of the structure, the dielectric region being disposed on the conductor portion of the first connection element and being a region of a dielectric material layer covering the upper face of the structure and at least a second connection element among said one or more connection elements;
    assembling on the upper face of the structure, and without prior etching of the dielectric material layer, a support including a semiconductor layer in which at least one second transistor is intended to be formed;
    forming at least one second insulator layer surmounting the second transistor at least partially produced and the first electrode of the resistive memory cell;
    forming one or more openings through the second insulator layer, at least one first opening among the one or more openings revealing the dielectric region of the resistive memory cell; and
    forming in the first opening at least one second electrode of the resistive memory cell on the dielectric region.

2. The method according to claim 1, wherein the support is assembled by bonding on the dielectric material layer or on a layer formed on the dielectric material layer.

3. The method according to claim 1, wherein the first electrode of the resistive memory cell is formed of the conductor portion coated with at least one metal layer, forming of the metal layer comprising:
    forming a mask on the first insulator layer, the mask being provided with at least one opening facing the conductor portion,
    etching the first insulator layer through the opening of the mask such as to reveal the conductor portion, and
    depositing the metal layer.

4. The method according to claim 1, wherein at least one second opening among said openings formed in the second insulator layer reveals a region of the second transistor.

5. The method according to claim 3, further comprising forming a conductor element in the second opening, the conductor element being connected to the second electrode of the resistive memory cell.

6. The method according to claim 1, further comprising forming the second insulator layer by:
    forming a hole traversing the second insulator layer and the dielectric material layer, the hole revealing the second connection element, and then
    filling the hole with a conductor material to form a conductor material element connected to the second connection element.

7. The method according to claim 6, wherein the hole is formed after said one or more openings through a masking layer blocking said one or more openings, the masking layer being removed prior to filling the openings and the hole with conductor material.

8. The method according to claim 1, the first connection element being connected to the first transistor.

9. The method according to claim 1, further comprising:
    forming another opening traversing the second insulator layer and revealing a conductor part connected to said first connection element, and
    forming in said another opening at least one contact pad with said conductor part.

10. A device with transistors distributed over several levels and provided with at least one resistive memory cell comprising a first electrode, a second electrode, and a dielectric region arranged between the first electrode and the second electrode, the device comprising:
    a structure provided with one or more connection elements in at least one first insulator layer surmounting a first transistor of a given level of components;
    a resistive memory cell of said at least one resistive memory cell comprising:
        the first electrode formed of at least one conductor portion of a first connection element among said one or more connection elements,
        a dielectric region being disposed on the conductor portion of the first connection element and being a region of a dielectric material layer covering the upper face of the structure and at least a second connection element among said one or more connection elements, the region of the dielectric material layer covering the upper face of the structure being a nonetched region of the dielectric material layer, and the second electrode of the resistive memory cell being disposed on the dielectric region; and at least one second transistor of a level above the given level.

11. The device according to claim 10, further comprising a conductor material element connected to the second connection element, the conductor material element passing in a hole through the dielectric material layer.

* * * * *